(12) United States Patent
Kawaguchi et al.

(10) Patent No.: US 9,457,977 B2
(45) Date of Patent: Oct. 4, 2016

(54) TAPE FEEDER AND TAPE FEEDER CABINET

(71) Applicants: Panasonic Corporation, Osaka (JP); Nidec Copal Electronics Corporation, Tokyo (JP)

(72) Inventors: Satoshi Kawaguchi, Yamanashi (JP); Shigekazu Yoneyama, Yamanashi (JP); Tatsuo Yamamura, Fukuoka (JP); Kazunori Kanai, Yamanashi (JP); Yuuki Nakada, Saitama (JP); Kiyoshi Tanaka, Saitama (JP); Toshiaki Numata, Saitama (JP)

(73) Assignees: PANASONIC CORPORATION, Osaka (JP); NIDEC COPAL ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/408,694

(22) PCT Filed: Jun. 17, 2013

(86) PCT No.: PCT/JP2013/003768
§ 371 (c)(1),
(2) Date: Dec. 17, 2014

(87) PCT Pub. No.: WO2013/190820
PCT Pub. Date: Dec. 27, 2013

(65) Prior Publication Data
US 2015/0305215 A1 Oct. 22, 2015

(30) Foreign Application Priority Data

Jun. 18, 2012 (JP) ................................. 2012-136936

(51) Int. Cl.
B65H 20/20 (2006.01)
H05K 13/04 (2006.01)
(52) U.S. Cl.
CPC .......... *B65H 20/20* (2013.01); *H05K 13/0417* (2013.01); *B65H 2553/51* (2013.01)
(58) Field of Classification Search
CPC ... B65H 20/20; B65H 2553/51; H05K 13/02
See application file for complete search history.

(56) References Cited

U.S. PATENT DOCUMENTS 6,379,098 B1 4/2002 Shibasaki
7,138,596 B2 * 11/2006 Pippin ....................... B07C 3/02
209/584

(Continued)

FOREIGN PATENT DOCUMENTS

CN 1413079 A 4/2003
CN 101444151 A 5/2009

(Continued)

OTHER PUBLICATIONS

International Search Report for Application No. PCT/JP2013/003768 dated Aug. 6, 2013.

(Continued)

*Primary Examiner* — Michael McCullough
(74) *Attorney, Agent, or Firm* — Pearne & Gordon LLP

(57) ABSTRACT

A gear unit 40 includes: a sprocket 32 including pins 31 provided on a periphery thereof and a final gear 42; and one or more transmission gears disposed between a drive motor 33 and the final gear 42. The pins 31 engage with feed holes provided at equal pitches in a carrier tape. A sensor 48 which detects an angle is provided to face a transmission gear, of the one or more transmission gears, of which a rotation ratio to the final gear 42 is 1:N (N is a positive integer).

5 Claims, 13 Drawing Sheets

(56) References Cited

U.S. PATENT DOCUMENTS

| | | |
|---|---|---|
| 2002/0062927 A1 | 5/2002 | Hwang et al. |
| 2003/0072644 A1 | 4/2003 | Yamamura et al. |
| 2004/0188024 A1 | 9/2004 | Hwang et al. |
| 2005/0160593 A1 | 7/2005 | Yamamura et al. |
| 2010/0284769 A1 | 11/2010 | Fritschy et al. |

FOREIGN PATENT DOCUMENTS

| | | |
|---|---|---|
| JP | 2001-044688 A | 2/2001 |
| JP | 2002-198690 A | 7/2002 |
| JP | 2007-227491 A | 9/2007 |
| JP | 2008-306046 A | 12/2008 |
| JP | 2010-287698 A | 12/2010 |

OTHER PUBLICATIONS

Chinese Office Action for Application No. 201380032216.X dated Apr. 29, 2016.
Chinese Search Reported for Application No. 201380032216.X dated Apr. 29, 2016.

* cited by examiner

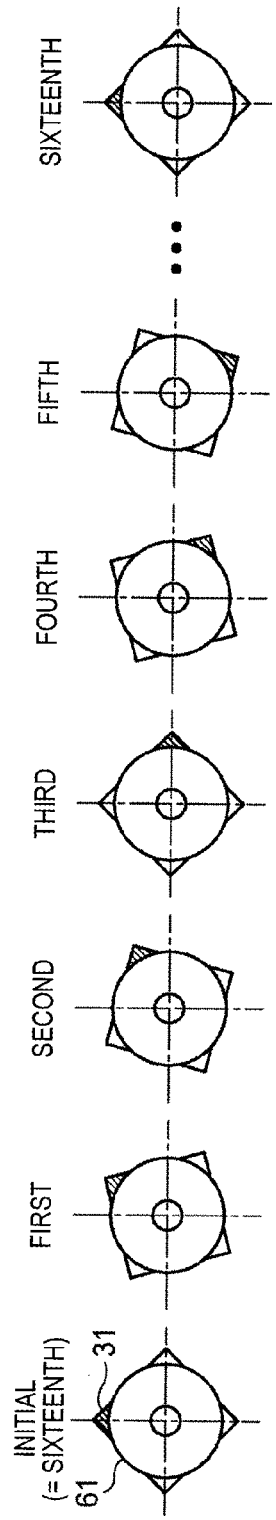
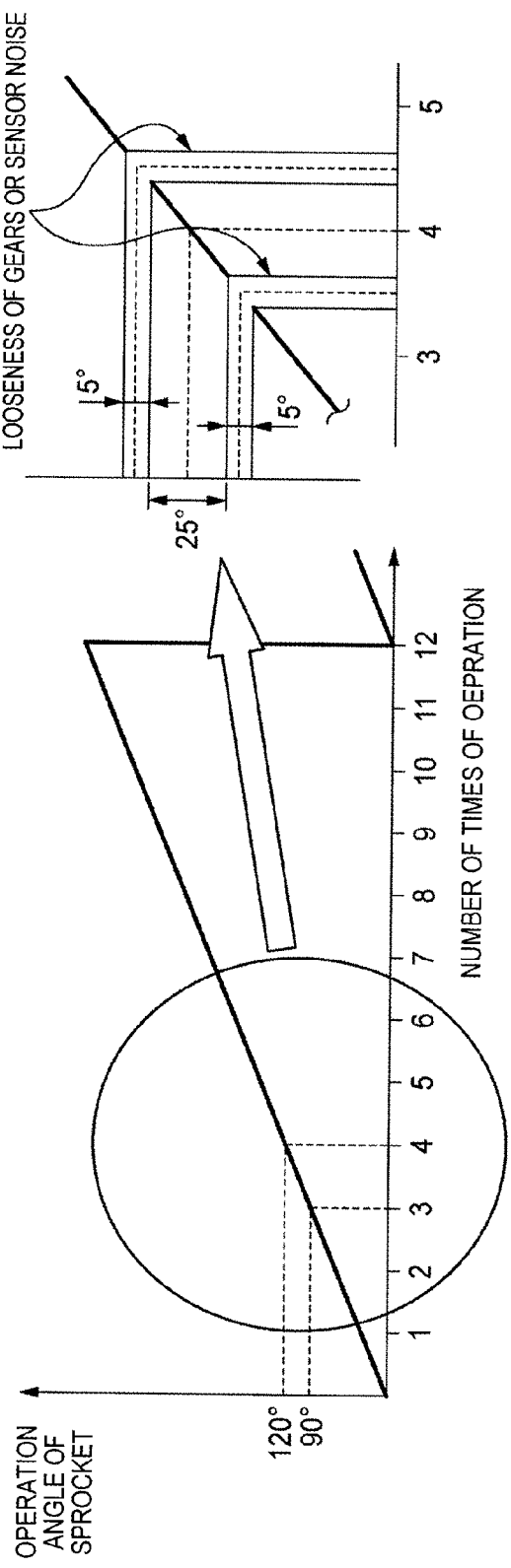
FIG. 9(A)
FIG. 9(B)
FIG. 9(C)

CORRECTION TABLE A

| NUMBER OF TIMES OF OPERATION OF DRIVE MOTOR | IDEAL POSITION OF PIN | DETECTION ANGLE |
|---|---|---|
| 0 | 0 | $\theta 0$ |
| 1 | ONE THIRD | $\theta 1$ |
| 2 | TWO THIRDS | $\theta 2$ |
| 3 | 1 | $\theta 3$ |
| 4 | 1 AND ONE THIRD | $\theta 4$ |
| 5 | 1 AND TWO THIRDS | $\theta 5$ |
| 6 | 2 | $\theta 6$ |
| 7 | 2 AND ONE THIRD | $\theta 7$ |
| 8 | 2 AND TWO THIRDS | $\theta 8$ |
| 9 | 3 | $\theta 9$ |
| 10 | 3 AND ONE THIRD | $\theta 10$ |
| 11 | 3 AND TWO THIRDS | $\theta 11$ |
| 12 | 0 | $\theta 12$ |

FIG. 15

CORRECTION TABLE B

| NUMBER OF TIMES OF OPERATION OF DRIVE MOTOR | POSITION INFORMATION OF PIN | IDEAL ANGLE | DISPLACEMENT (CORRECTION ANGLE) |
|---|---|---|---|
| 0 | 0 | 0 | $a0$ |
| 1 | ONE THIRD | 30 | $a1$ |
| 2 | TWO THIRDS | 60 | $a2$ |
| 3 | 1 | 90 | $a3$ |
| 4 | 1 AND ONE THIRD | 120 | $a4$ |
| 5 | 1 AND TWO THIRDS | 150 | $a5$ |
| 6 | 2 | 180 | $a6$ |
| 7 | 2 AND ONE THIRD | 210 | $a7$ |
| 8 | 2 AND TWO THIRDS | 240 | $a8$ |
| 9 | 3 | 270 | $a9$ |
| 10 | 3 AND ONE THIRD | 300 | $a10$ |
| 11 | 3 AND TWO THIRDS | 330 | $a11$ |
| 12 | 0 | 360 | $a12$ |

TAPE FEEDER AND TAPE FEEDER CABINET

TECHNICAL FIELD

The present invention relates to a tape feeder attachable to an electronic component mounting apparatus to supply electronic components, and also relates to a tape feeder gear unit.

BACKGROUND ART

In recent years, there is a need to improve productivity per unit area of an electronic component mounting apparatus, and a tape feeder for supplying components to the electronic component mounting apparatus has been desired to be thinner for increasing the number of tape feeders mounted in the electronic component mounting apparatus. In each tape feeder, the width direction of a carrier tape agrees with the width direction of a feeder housing. In related art, a tape feeder includes a sprocket including pins provided on a periphery thereof and capable of engaging with feed holes provided at equal pitches in the carrier tape retaining electronic components. The sprocket is disposed so that a direction extending in the rotational center axis thereof can agree with the width direction of the feeder housing.

When the sprocket is rotated intermittently, the tape feeder can supply each electronic component to a pickup position of the electronic component mounting apparatus. A sensor for detecting the rotation angle of the sprocket engaging with the carrier tape is embedded in the tape feeder in order to accurately pitch-feed the carrier tape. In the related art, the sensor detects the rotation angle based on analysis of irregular patterns formed in a side surface of the sprocket. The tape feeder creates a correction amount table from the detected rotation angle. Using the correction amount table, a feeder adjustment device can accurately adjust the stop position of the carrier tape after the pitch feeding (see Patent Document 1).

RELATED ART DOCUMENTS

Patent Documents

Patent Document 1: JP-A-2007-227491 (claim 1, FIG. 5, and Paragraph 0016)

SUMMARY OF THE INVENTION

Problem to be Solved by the Invention

However, when it is intended to make the tape feeder thin, it is not possible to secure an enough space to dispose the sensor in opposition to the sprocket. Thus, there is a problem that it is difficult to make the tape feeder thin. In the background-art structure, this is because the irregular patterns are formed in the side surface of the sprocket which is especially large of constituent parts of the tape feeder built in the feeder housing, and the sensor is disposed to face the irregular patterns. As a result, it is necessary to secure a space large enough to arrange the sprocket and the sensor in a direction along the rotation center axis of the sprocket, that is, in the width direction of the feeder housing. Thus, the tape feeder is enlarged in the thickness direction.

The present invention has been made in consideration of the above-described circumstances, and an object thereof is to provide a tape feeder and a tape feeder gear unit capable of making the tape feeder thin while accurately adjusting a stop position of a carrier tape after pitch feeding.

Means for Solving the Problem

In a tape feeder of the present invention, a carrier tape retaining electronic components is pitch-fed by a gear unit so as to supply an electronic component to a pickup position of an electronic component mounting apparatus, the gear unit including: a sprocket which includes pins provided on a periphery thereof and a final gear, the pins meshing with feed holes provided at equal pitches in the carrier tape; and one or more transmission gears disposed between a drive motor and the final gear, wherein a sensor which detects an angle is provided to face a transmission gear, of the one or more transmission gears, of which a rotation ratio to the final gear is 1:N (N is a positive integer).

In the tape feeder of the present invention, the transmission gear of which the angle is detected by the sensor is a transmission gear of which a rotation ratio to the final gear is 1:1 and which directly meshes with the final gear.

In the tape feeder of the present invention, a drive gear provided on an output shaft of the drive motor is provided on an opposite side to the sprocket with respect to a center line of the tape feeder in a width direction.

A tape feeder gear unit of the present invention pitch-feeds a carrier tape retaining electronic components so as to supply an electronic component to a pickup position of an electronic component mounting apparatus, the tape feeder gear unit including: a sprocket which includes pins provided on a periphery thereof and a final gear, the pins meshing with feed holes provided at equal pitches in the carrier tape; and one or more transmission gears disposed between a drive motor and the final gear, wherein a sensor which detects an angle is provided to face a transmission gear, of the one or more transmission gears, of which a rotation ratio to the final gear is 1:N (N is a positive integer).

The tape feeder gear unit of the present invention includes control means for: rotationally driving the sprocket by the drive motor; acquiring angle information of an absolute sensor provided in the transmission gear for each of angles with which one full rotation of the sprocket is divided equally, and angle information obtained from a motor encoder provided inside the drive motor; creating a correction table for rotating the sprocket at each of the angles based on the angle information of the absolute sensor and the angle information of the drive motor; and rotationally controlling the drive motor using the correction table.

The tape feeder gear unit of the present invention includes control means for: rotationally driving the sprocket by the drive motor; acquiring angle information of the absolute sensor provided in the transmission gear whenever the drive motor is rotationally driven at a constant angle; creating a correction table based on angle error information between a theoretical rotation angle of the drive motor and the angle information of the absolute sensor; and rotationally controlling the drive motor using the correction table.

Advantages of the Invention

According to a tape feeder and a tape feeder gear unit of the present invention, the tape feeder can be made thin while a stop position of a carrier tape after pitch feeding is accurately adjusted.

BRIEF DESCRIPTION OF THE DRAWINGS

FIG. 9(A) is a view for explaining the definition of rotation in the case of a four-pin sprocket, FIG. 9(B) is a chart of correlation between the operation angle of the sprocket and the number of times of operation, and FIG. 9(C) is a view for explaining a detection range of the sensor.

FIG. 15 is a view for explaining the correction table B.

MODE FOR CARRYING OUT THE INVENTION

An embodiment according to the present invention will be described below with reference to the drawings.

Figure 1:
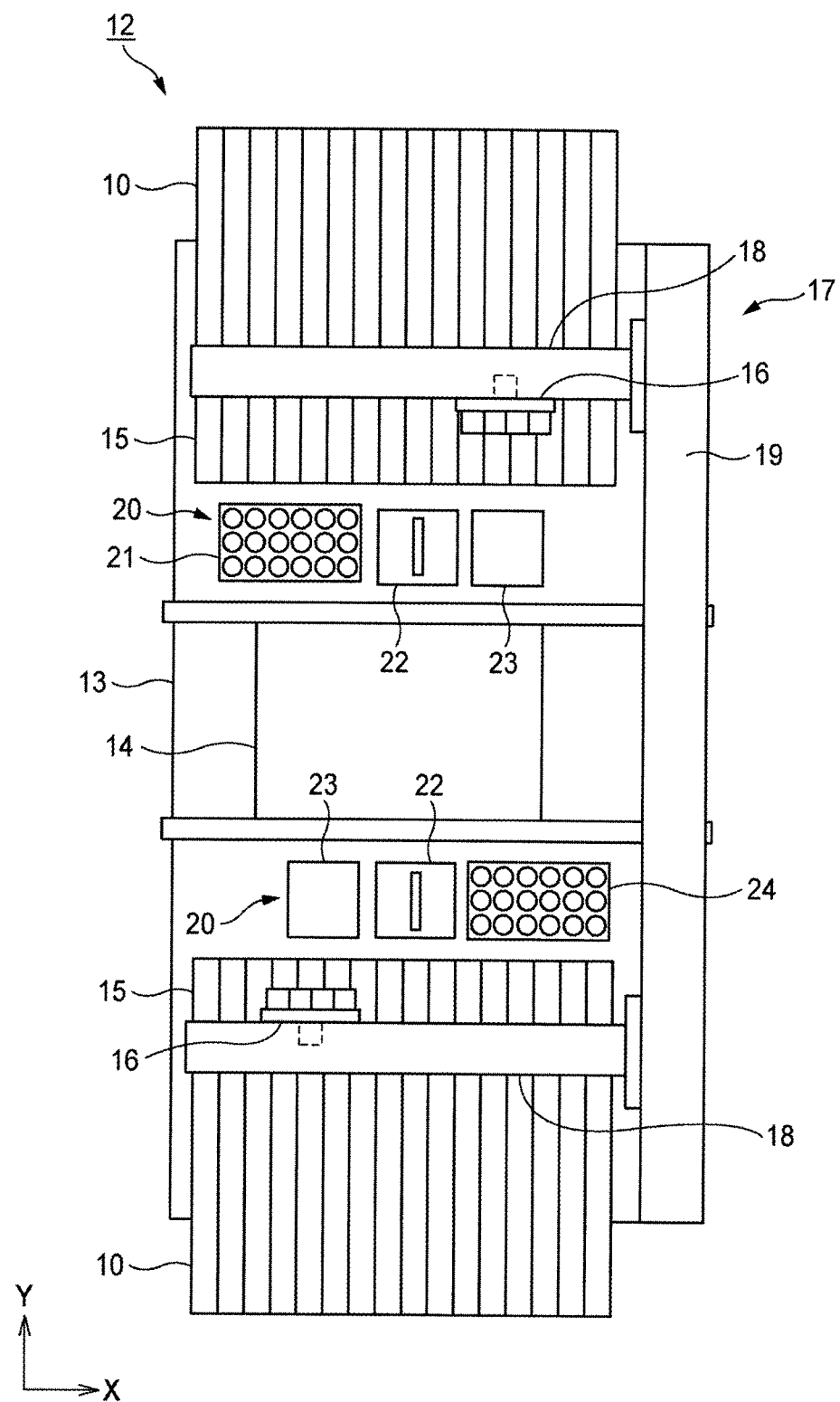
FIG. 1 is a plan view of an electronic component mounting apparatus provided with tape feeders according to an embodiment of the present invention.
Figure 2:
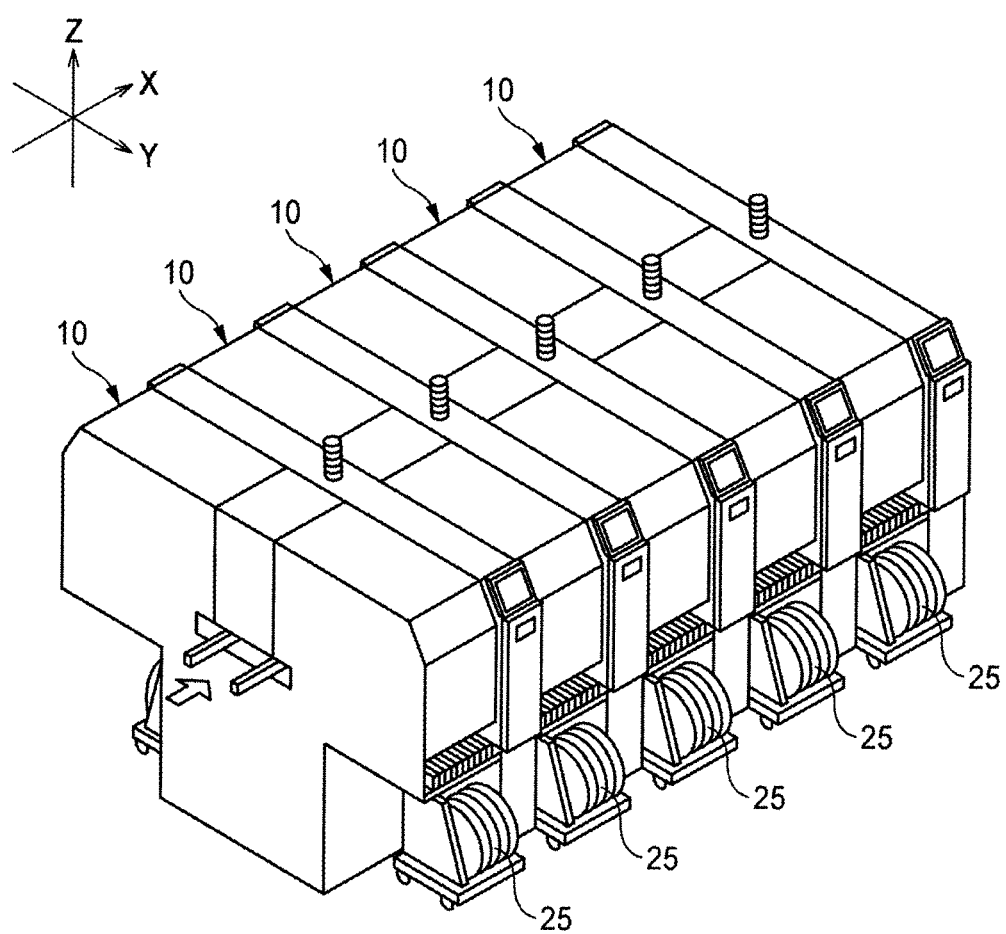
FIG. 2 is a perspective view of the tape feeders shown in FIG. 1.
Figure 3:
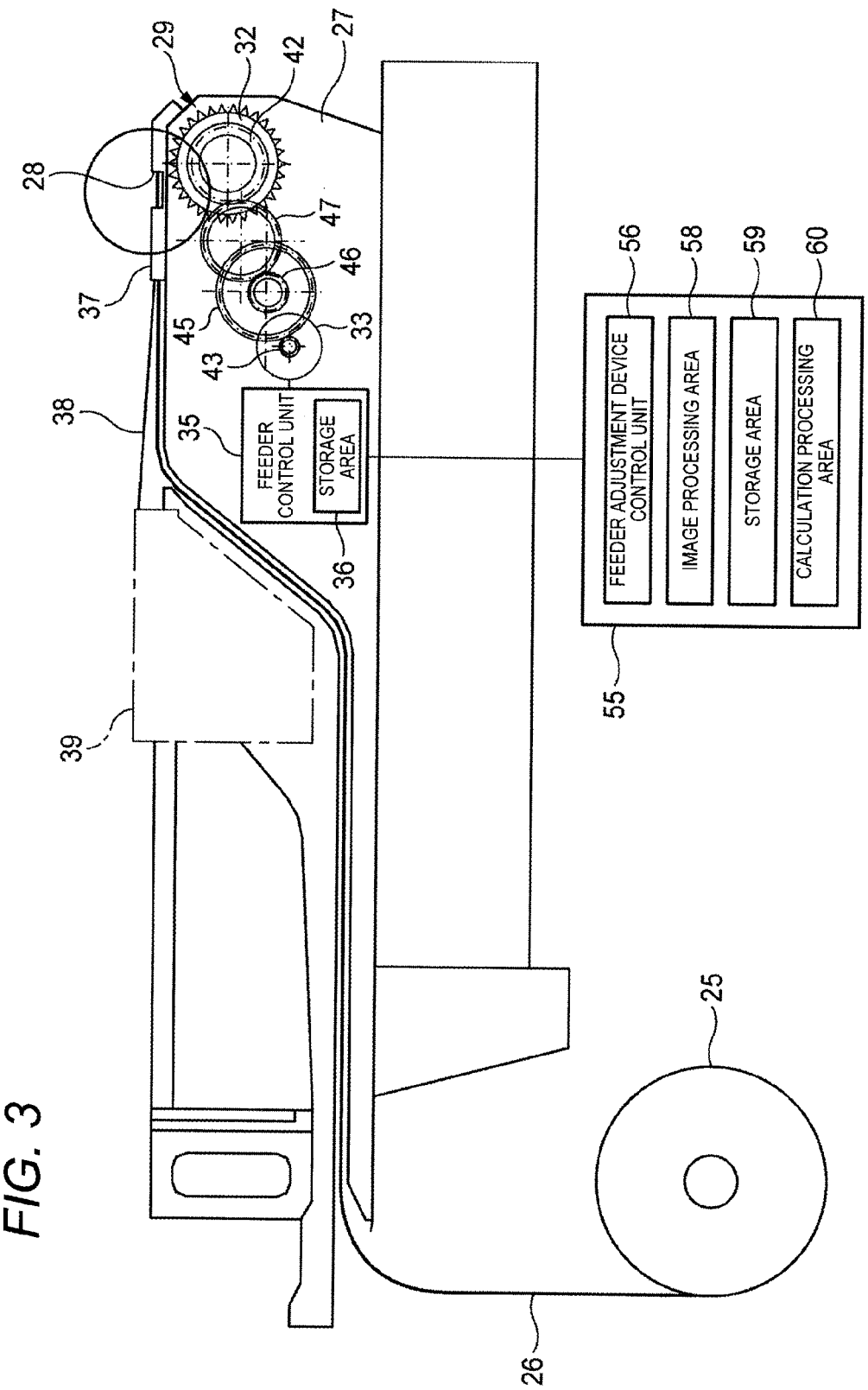
FIG. 3 is a side view showing the configuration of each tape feeder.
Figure 4A:
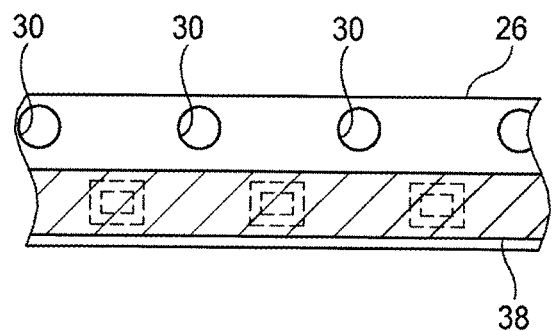
FIG. 4(A) is a plan view of a tape.
Figure 4B:
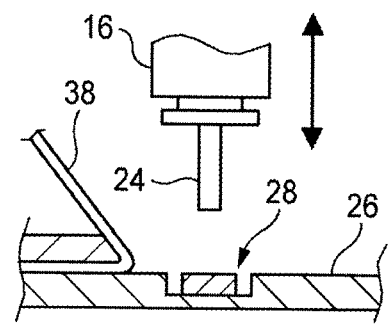
FIG. 4(B) is a side view of the tape where a component suction nozzle has been positioned.
Figure 4C:
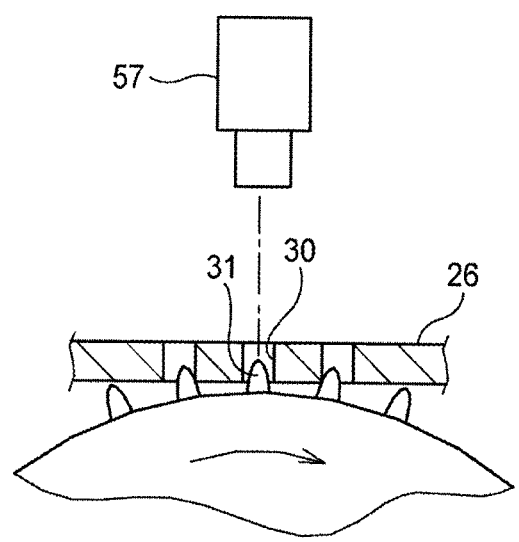
FIG. 4(C) is a main portion side view of a sprocket where a camera has been disposed above pins.
Figure 5:
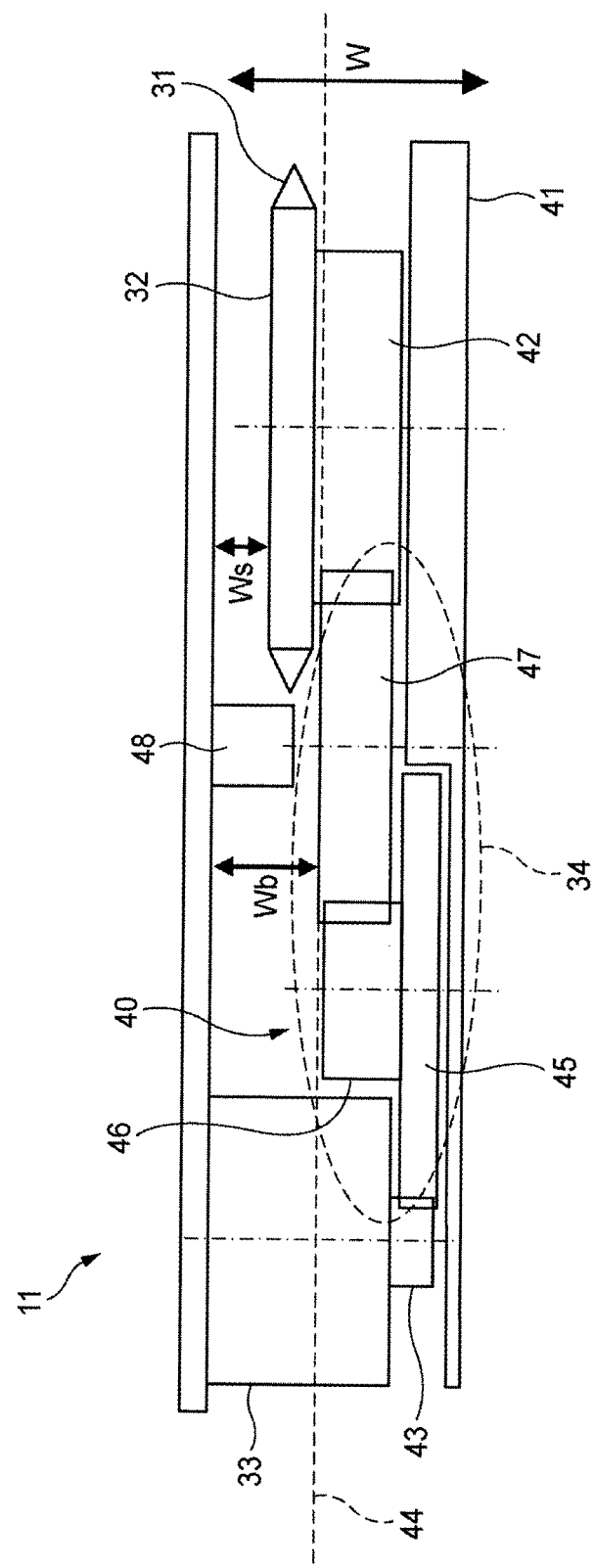
FIG. 5 is a plan view of a tape feeder gear unit.
Figure 6:
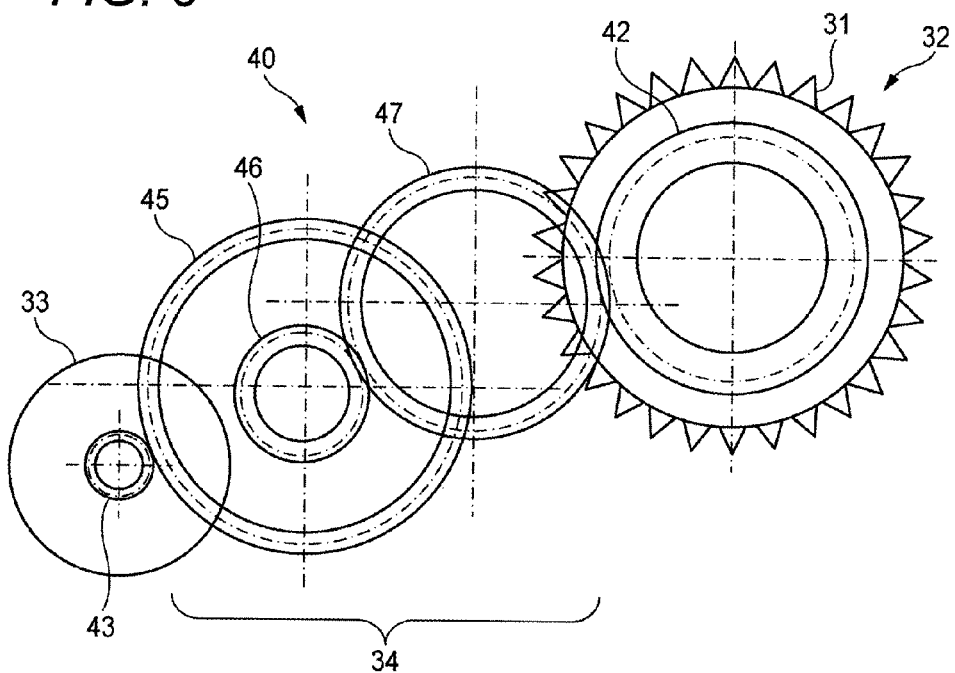
FIG. 6 is a side view of the gear unit.
Figure 7:
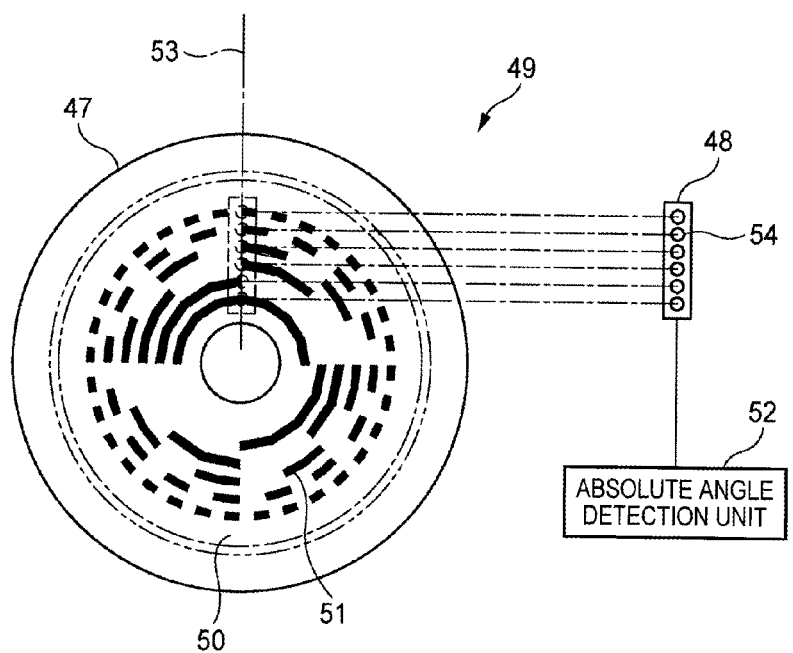
FIG. 7 is a schematic view of an encoder including a transmission gear and a sensor, irregular patterns being formed in a side surface of the transmission gear.

FIG. 1 is a plan view of an electronic component mounting apparatus provided with tape feeders according to the embodiment of the invention. FIG. 2 is a perspective view of the tape feeders shown in FIG. 1. FIG. 3 is a side view showing the configuration of each tape feeder. FIG. 4(A) is a plan view of a tape, FIG. 4(B) is a side view of the tape where a component suction nozzle has been positioned, and FIG. 4(C) is a main portion side view of a sprocket where a camera has been disposed above pins. FIG. 5 is a plan view of a tape feeder gear unit. FIG. 6 is a side view of the gear unit. FIG. 7 is a schematic view of an encoder including a transmission gear and a sensor, irregular patterns being formed in a side surface of the transmission gear.

Tape feeders 10 and tape feeder gear units 11 (see FIG. 5) according to the embodiment are mounted on an electronic component mounting apparatus 12. First, the overall configuration of the electronic component mounting apparatus 12 will be described. In the electronic component mounting apparatus 12, a board fixing portion (conveyor rail) for fixing a circuit board 14 to be mounted with electronic components (not shown) is provided in a central portion of a base 13. The base 13 is provided with a pair of component mounting stages 15 which are located symmetrically with respect to the board fixing portion. Each component mounting stage 15 is provided with a plurality of lines of tape feeders 10 for supplying electronic components continuously, so that a large number of kinds of electronic components can be sucked in a component supply position.

Each component mounting stage 15 is provided with a suction head 16 for holding an electronic component in the component supply position and mounting the electronic component on the circuit board 14. The suction head 16 is supported on an XY robot 17. The XY robot 17 can move both in the X and Y directions in FIG. 1, so as to move the suction head 16 to the component supply position or to above the circuit board 14. The XY robot 17 has an X-axis beam 18. The suction head 16 is supported on the X-axis beam 18 movably in the X direction. The X-axis beam 18 can move in the Y direction along a Y-axis beam 19.

A nozzle change portion 20 is provided between the component mounting stage 15 and the board fixing portion. A nozzle holder 21, a component recognition portion 22 and a disposal tray 23 are provided in the nozzle change portion 20. The nozzle holder 21 stores component suction nozzles 24 for various electronic components to be mounted on the suction head 16. The suction head 16 can replace one component suction nozzle 24 with another by means of the nozzle change portion 20. The component recognition portion 22 is provided with an optical sensor including a line sensor or the like, so as to recognize the posture (component position, rotation angle, etc.) of the electronic component sucked by the component suction nozzle 24 of the suction head 16. When there is an error as to the kind of the electronic component sucked by the component suction nozzle 24 of the suction head 16 or there is a trouble in the same electronic component, the electronic component is discarded and put on the disposal tray 23.

Next, the configuration of the tape feeders 10 will be described.

The tape feeders 10 are held on a carriage (not shown) so that an operator can operate the carriage to removably attach the tape feeders 10 to the electronic component mounting apparatus 12. A tape reel 25 shown in FIG. 2 is attached to each tape feeder 10, and a tape 26 shown in FIG. 3 is wound around the tape reel 25. Electronic components are retained at equal pitches on the tape 26.

Each tape feeder 10 has a function of performing feeding operation for feeding the tape 26 inside an outer frame 27 shown in FIG. 3 so that the electronic components retained at equal pitches on the tape 26 can be pitch-fed to a supply port 28. A tape feeding mechanism 29 is disposed in a front end portion inside the outer frame. The tape feeding mechanism 29 has a sprocket 32. Pins 31 which can engage with feed holes 30 (see FIG. 4(A) and FIG. 4(C)) formed at equal pitches in the feeding direction of the tape 26 are formed in the outer periphery of the sprocket 32. In addition, the tape feeding mechanism 29 has a drive motor 33 serving as means for rotationally driving the sprocket 32, a transmission mechanism 34 (see FIG. 6) for transmitting the rotational driving of the drive motor 33 to the sprocket 32, and a feeder control unit 35 serving as control means for controlling the rotational driving of the drive motor 33. The feeder control unit 35 includes a storage area 36, which stores control programs and various data including a correction table A and a correction table B, which will be described later, as well as the retention pitch of electronic components.

When the drive motor 33 is controlled to intermittently rotate in accordance with the retention pitch of electronic components, the sprocket 32 performs index rotation so that the tape 26 wound around the tape reel 25 can be retracted into the outer frame 27 from the rear end portion and pitch-fed to the front end portion. Thus, the electronic components retained on the tape 26 are supplied sequentially to the supply port 28 which is a pickup position. The supply port 28 is opened and formed in a part of a tape guide 37 which is attached to the top of the outer frame 27 so as to guide the feeding of the tape 26. A part of the tape guide 37 is formed as a folding portion where a cover tape 38 peeled from the surface of the tape 26 should be folded back. The cover tape 38 is peeled from the surface of the tape 26 by a cover tape peeling mechanism 39. Thus, as shown in FIG. 4(B), an electronic component which has been exposed is supplied to the supply port 28 and picked up by the component suction nozzle 24 positioned above the supply port 28.

In the tape feeder gear unit 11, as shown in FIG. 5, a gear unit 40 serving as the transmission mechanism 34 is provided in a feeder housing 41. The gear unit 40 is provided with the sprocket 32 which includes a final gear 42 as well as the pins 31 provided peripherally to engage with the feed holes 30 provided at equal pitches in the tape 26, and at least one transmission gear which is disposed between the drive motor 33 and the final gear 42.

In addition, in the gear unit 40, a drive gear 43 provided on the output shaft of the drive motor 33 is provided on the opposite side to the sprocket 32 with respect to a width-direction center line 44 of the tape feeder 10.

As shown in FIG. 6, the gear unit 40 includes a gear train including the drive gear 43, a first transmission gear 45, a second transmission gear 46, a third transmission gear 47 and the final gear 42. The drive gear 43 is attached to the output shaft of the drive motor 33. The first transmission gear 45 meshes with the drive gear 43. The second transmission gear 46 is coaxially fixed to the first transmission gear 45. The second transmission gear 46 meshes with the third transmission gear 47. The third transmission gear 47 meshing with the second transmission gear 46 also meshes with the final gear 42 coaxially fixed to the rotation shaft of the sprocket 32. More specifically the drive gear 43, for example, includes 12 teeth. The first transmission gear 45 includes 120 teeth; the second transmission gear 46, 20 teeth; the third transmission gear 47, 60 teeth; and the final gear 42, 60 teeth. The sprocket 32 includes 30 pins.

Accordingly, the reduction gear ratio between the drive motor 33 and the first transmission gear 45 is 120/12=10; the reduction gear ratio between the second transmission gear 46 and the third transmission gear 47 is 60/20=3; and the reduction gear ratio between the third transmission gear 47 and the sprocket 32 (final gear 42) is 60/60=1. As a result, the reduction gear ratio between the drive motor 33 and the sprocket 32 is 10×30×1=30.

Incidentally, the numbers of teeth and the reduction gear ratios are examples, but the invention is not limited to the numbers of teeth and the reduction gear ratios.

In the gear unit 40, a sensor (absolute sensor 48) shown in FIG. 5 is provided for detecting an angle so as to face a transmission gear, of the one or more transmission gears, whose rotation ratio to the final gear 42 is 1:N (N is a positive integer). In the embodiment, the transmission gear whose rotation ratio to the final gear 42 is 1:N is the third transmission gear 47. Further, the third transmission gear 47 whose angle is detected by the absolute sensor 48 has a rotation ratio of 1:1 to the final gear 42 and directly meshes with the final gear 42.

A pattern formation surface 50 where irregular patterns 51 expressing the absolute rotation angle of the sprocket 32 are formed is provided in a side surface of the third transmission gear 47. The irregular patterns 51 are detected by the absolute sensor 48 provided in a position facing the irregular patterns 51 of the pattern formation surface 50. The detected irregular patterns 51 are analyzed by an absolute angle detection unit 52, and the absolute rotation angle of the third transmission gear 47 is detected. The absolute angle detection unit 52 belongs to the feeder control unit 35.

Incidentally, the pattern formation surface 50 and the irregular patterns 51 formed thereon are collectively referred to as an encoder 49.

Six different irregular patterns 51 are formed on diametrally different and concentric circles around the rotation shaft of the third transmission gear 47 respectively, and intervals of irregularities are varied to be denser as going from an inner concentric circle toward an outer one. Thus, the combination of six irregularities located in a recognition line 53 changes in accordance with the rotation angle of the third transmission gear 47.

The absolute sensor 48 is fixed in a position (shown by the broken line in FIG. 7) facing the pattern formation surface 50 in the recognition line 53 and at a predetermined distance from the pattern formation surface 50. The absolute sensor 48 has six photosensors 54 for detecting irregularities on the six diametrally different and concentric circles. Each photosensor 54 detects a distance from the pattern formation surface 50 serving as a portion to be detected, and thereby detects which is in the opposed position, a concave part or a convex part. Detection signals obtained by the six photosensors 54 are transmitted to the absolute angle detection unit 52, in which the absolute rotation angle of the sprocket 32 meshing with the third transmission gear 47 is detected by the combination of the six irregular patterns 51.

Various forms may be used as the patterns formed in the pattern formation surface 50 and the absolute sensor 48 for detecting the patterns. For example, not a reflection type absolute sensor but a transmission type absolute sensor may be used when optical sensors such as the photosensors 54 are used. In this case, in the pattern formation surface 50, pattern holes may be formed or materials different in reflectivity may be arranged and patterned so as to provide a form changing in accordance with the absolute rotation angle of the sprocket 32. Alternatively, when magnetic sensors are used, magnetic patterns may be formed in the pattern formation surface 50 so as to provide a change in magnetic intensity or change the magnetic field in accordance with the absolute rotation angle of the sprocket 32. Further, when electrostatic sensors are used, electrostatic patterns may be formed in the pattern formation surface 50 so as to provide a change in electrostatic capacity or change the electric field in accordance with the absolute rotation angle of the sprocket 32. Further, materials different in electric resistance may be arranged and patterned in the pattern formation surface 50, so that a change in current or voltage in an electric circuit in contact with the pattern formation surface 50 can be detected to thereby detect the absolute rotation angle of the sprocket 32.

In addition, the pattern formation surface 50 may be formed integrally with a side surface of the third transmission gear 47 or the pattern formation surface 50 formed in advance may be attached to the side surface of the third transmission gear 47 which has been formed. In the case where the pattern formation surface 50 is formed integrally with the side surface of the third transmission gear 47, irregularities or pattern holes may be formed at the same time when the third transmission gear 47 is manufactured, or the side surface of the third transmission gear 47 which has been formed may be processed directly to form the irregularities or pattern holes. On the other hand, in the case where the pattern formation surface 50 is attached to the side surface of the third transmission gear 47 which has been formed, the pattern formation surface 50 may be attached directly to the side surface of the third transmission gear 47 or may be attached to the third transmission gear 47 through spacers if the pattern formation surface 50 can rotate in sync with the rotation of the third transmission gear 47.

In this manner, the pattern formation surface 50 which can change into different forms in accordance with the rotation angle of the third transmission gear 47 is provided to rotate in sync with the third transmission gear 47. Based on the form of the pattern formation surface 50, the absolute angle of the third transmission gear 47 is detected. It is therefore unnecessary to build a disc or the like for detecting the rotation angle in link with the tape feed mechanism 29. In addition, it is possible to detect the absolute angle of the third transmission gear 47, that is, the sprocket 32 with high accuracy in a space saving manner.

Dimensional errors caused by processing accuracy are generally present in gears. In a gear train including a plurality of gears, errors of the gears are piled up so that the correlation between the rotation angle of the drive gear 43 and the rotation angle of the final gear 42 cannot be grasped. However, when the third transmission gear 47, the second transmission gear 46, the first transmission gear 45 and the drive gear 43 linked with the final gear 43 have rotation numbers which are integral multiples of the rotation number of the final gear 42 as described above, errors of the other gears than the final gear 42 appear periodically during one full rotation of the final gear 42. Therefore, an error appearing in the absolute rotation angle of the final gear 42 is repeated in a cycle of one rotation.

In the tape feeder 10, electronic components retained at equal pitches on the tape 26 are supplied sequentially to the supply port 27. On this occasion, in order to prevent variations in the positions to which the electronic components are fed, it is necessary to accurately adjust the stop position of the tape 26 or the sprocket 32 for each pitch-feeding. To this end, a feeder adjustment device 55 shown in FIG. 3 is provided in the tape feeder 10. Using the correction table A or the correction table B which will be described later, the feeder adjustment device 55 calculates a correction amount for the driving amount of the drive motor 33 in order to adjust the stop position after pitch feeding in the tape feeder 10. Based on the result of the calculation, the feeder control unit 35 provided in the tape feeder 10 controls the driving amount of the drive motor 33.

The feeder adjustment device 55 is connected to the feeder control unit 35 of the tape feeder 10. During feeder adjustment, control commands or various data can be transmitted and received between the feeder control unit 35 and a feeder adjustment device control unit 56. An external measuring instrument 57 (see FIG. 4(C)) such as a camera is provided in the feeder adjustment device 55. The external measuring instrument 57 is disposed in a position which is above the supply port 28 of the tape feeder 10.

Alternatively, a not-shown high-precision rotary encoder may be attached onto the rotation shaft of the sprocket 32 so as to rotate in sync with the sprocket 32, so that the rotation angle of the sprocket 32 can be detected directly. The rotary encoder is used for creating the correction table B which will be described later. After the correction table B is created, the rotary encoder has to be removed. However, the rotary encoder can perform high-precision measurement more easily than an optical external measuring instrument such as a camera.

The feeder adjustment device 55 includes an image processing area 58, a storage area 59 and a calculation processing area 60. The image processing area 58 performs processing on an image taken by the external measuring instrument 57 and recognizes the position of an imaged target. The storage area 59 stores various data such as reference stop positions of the tape 26 and the sprocket 32, control programs, etc. The calculation processing area 60 measures an error between the stop position of the tape 26 or the stop position of the sprocket 32 recognized by the image processing area 58 and its reference stop position stored in the storage area 59.

The feeder adjustment device 55 measures an error between the stop position of the tape 26 and its reference stop position and an error between the stop position of the sprocket 32 and its reference stop position during one full rotation of the sprocket 32. Then the feeder adjustment device 55 creates a correction table in which the errors are associated with the absolute rotation angle of the sprocket 32 detected by the encoder 49, and the created correction table is stored in the storage area 59.

The feeder adjustment device 55 updates the correction table A and the correction table B in a correction step. The updated correction table A and the updated correction table B are stored in the storage area 36 of the feeder control unit 35 and used accordingly.

It is sufficient to perform the correction step once for each tape feeder gear unit. The correction step is usually provided just after or just before the gear unit is completed. Incidentally, the correction table A or the correction table B stored once for each gear unit is used as correction data peculiar to the gear unit.

Figure 8:
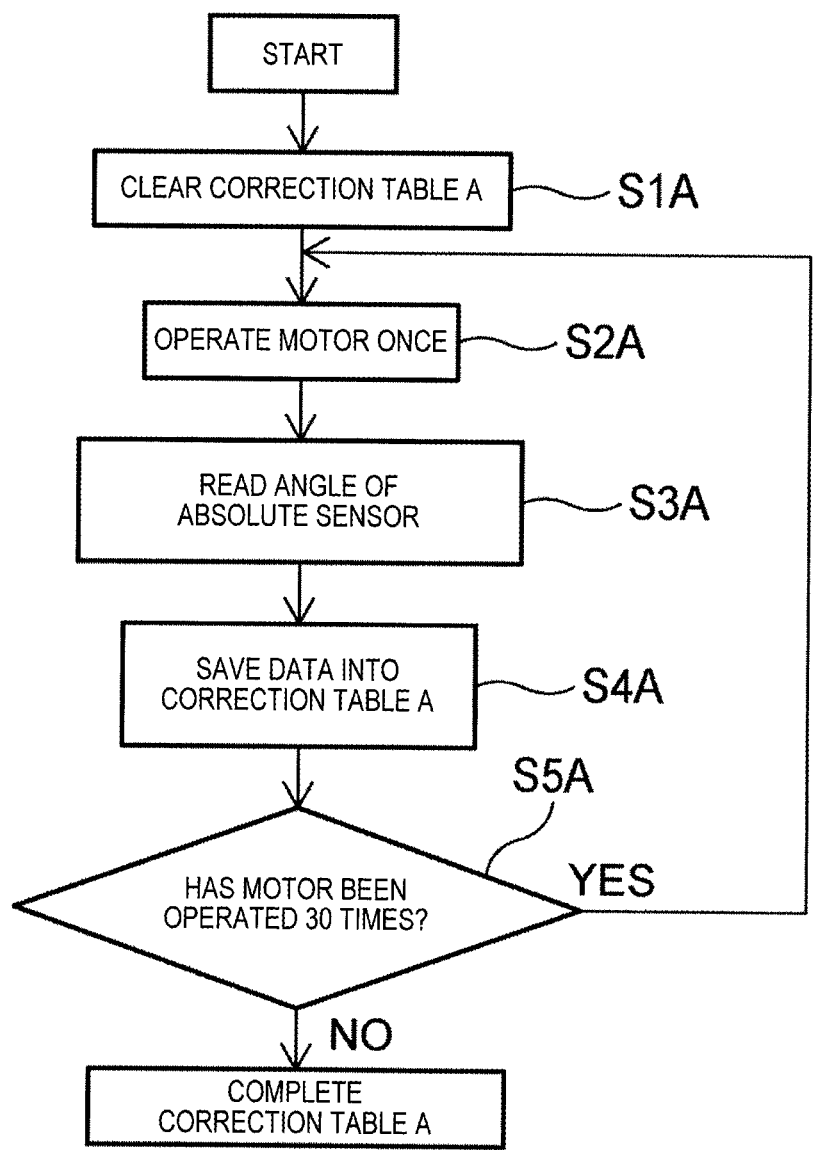
FIG. 8 is a flow chart showing a procedure for creating a correction table A.

FIG. 8 is a flow chart showing a procedure for creating the correction table A.

The correction table A is a correction table based on angle error information between the rotation angle (theoretical value) of the drive motor 33 and the angle information of the absolute sensor 48.

The correction table A is cleared in Step (S1A). The drive motor 33 is operated once in Step 2 (S2A). On assumption that the number of pins 31 of the sprocket 32 is 30, setting is done so that the sprocket 32 can rotate at an angle of 12 degrees (360 degrees/30=12 degrees) whenever the drive motor 33 operates once. The angle information of the absolute sensor 48 is read in Step 3 (S3A). Data are saved into the correction table A in Step 4 (S4A). Whether the absolute sensor 48 has made one full rotation (in this case, the drive motor 33 has operated 30 times) or not is checked in Step 5 (S5A). When the drive motor 33 has operated 30 times, the correction table A corresponding to the respective pins 31 of the sprocket 32 is completed. When the drive motor 33 has not operated 30 times, Step 2 (S2A) to Step 5 (S5A) are repeated.

Figure 10:
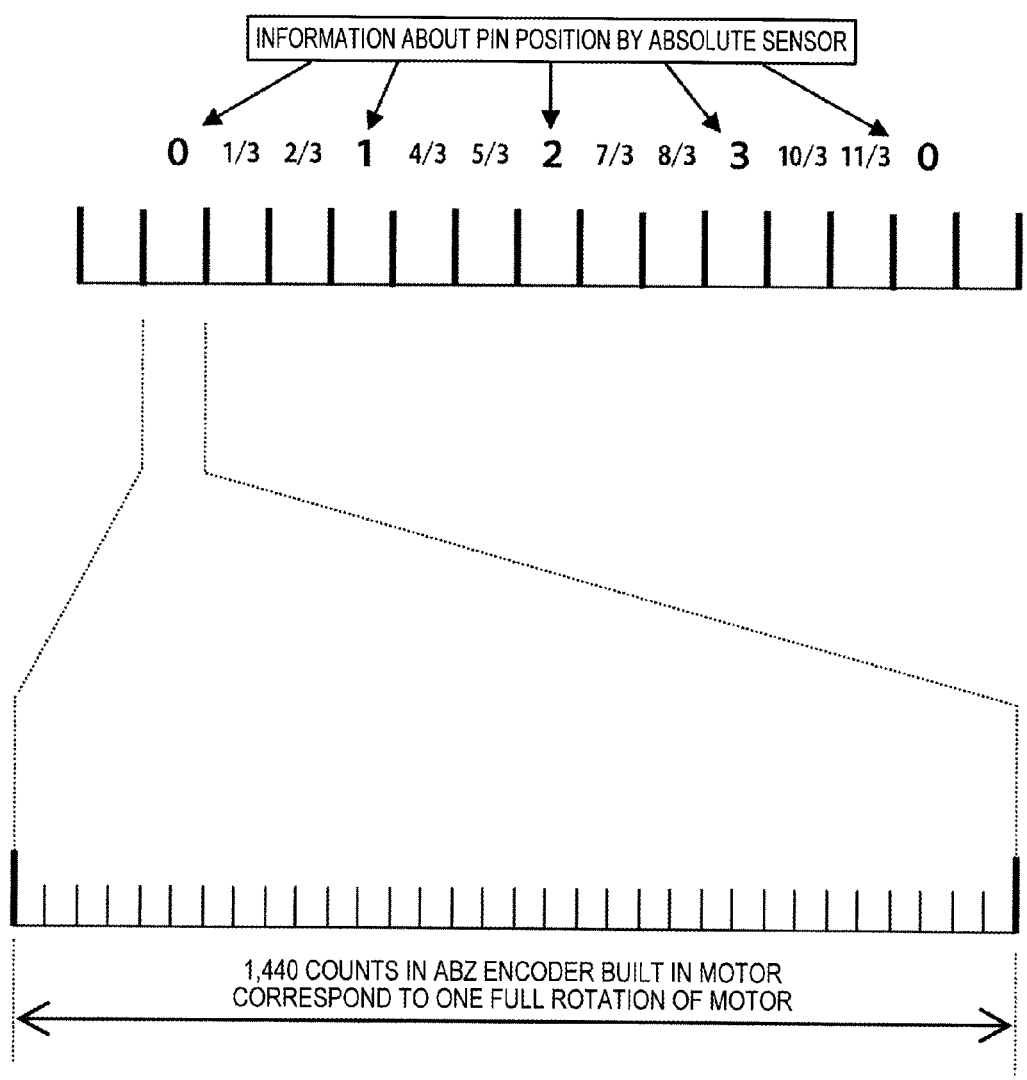
FIG. 10 is a view for explaining the relationship between an absolute sensor and a motor encoder.
Figure 11A:
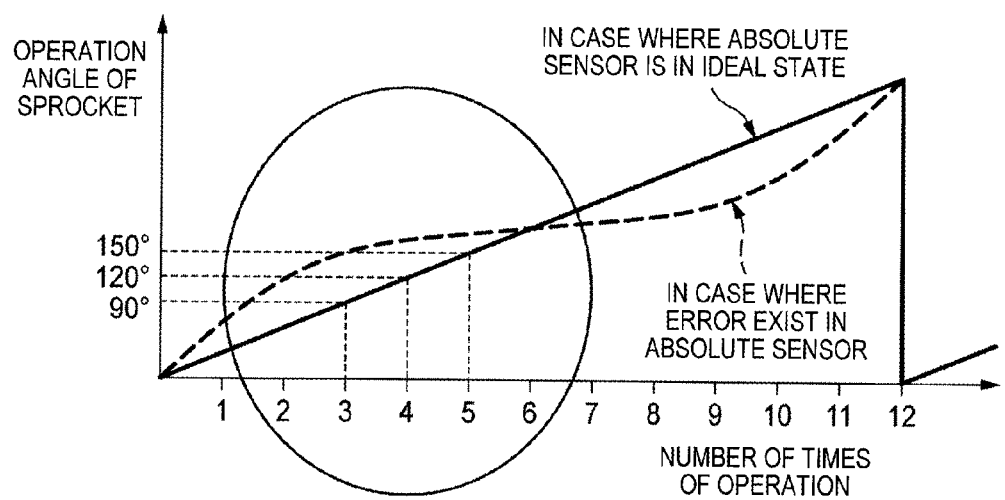
FIG. 11(A) is a chart of correlation between the operation angle of the sprocket and the number of times of operation when there is an error in the absolute sensor.
Figure 11B:
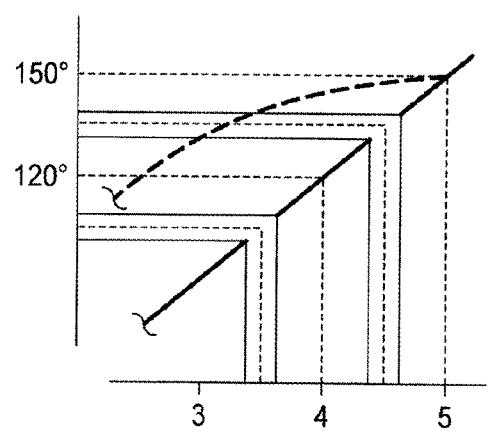
FIG. 11(B) is a main portion enlarged view of FIG. 11(A).
Figures 12, 13:
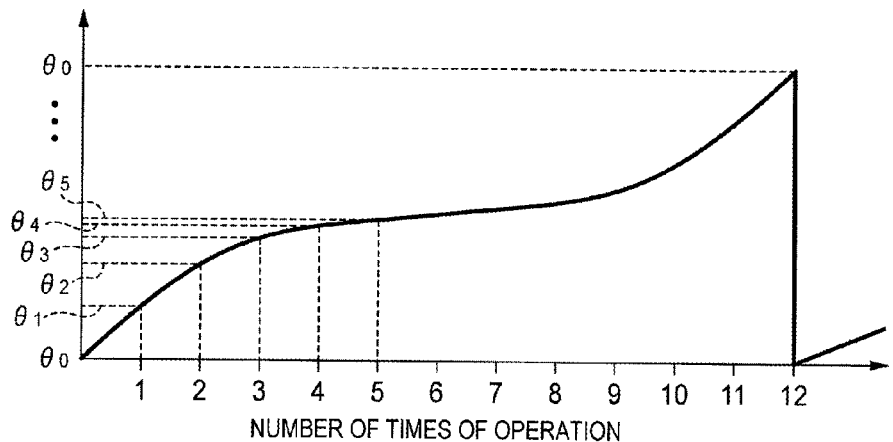
FIG. 12 is a chart of correlation between the detection angle of the absolute sensor and the number of times of operation.
FIG. 13 is a view for explaining the correction table A.

FIG. 9(A) is a view for explaining the definition of rotation in the case where the number of pins of the sprocket is four. FIG. 9(B) is a chart of correlation between the operation angle of the sprocket and the number of times of operation. FIG. 9(C) is a view for explaining a detection range of the sensor. FIG. 10 is a view for explaining the relationship (difference in resolution) between information of the absolute sensor 48 as to the pin position of the sprocket and the position information of an ABZ encoder provided inside the drive motor 33. FIG. 11(A) is a chart of correlation between the operation angle of the sprocket and the number of times of operation of the drive motor 33 when there is an error in the absolute sensor 48. FIG. 11(B) is a main portion enlarged view of FIG. 11(A). FIG. 12 is a chart of correlation between the detection angle of the absolute sensor 48 and the number of times of operation of the drive motor 33. FIG. 13 is a view for explaining the correction table A.

Here, the correction table A will be described using a simplified sprocket 61 by way of example, in which the sprocket has four teeth and a gear has a reduction ratio of 1/12. In the simplified sprocket 61, the minimum operation amount at one time (the rotation angle of the simplified sprocket 61 when the drive motor 33 makes one full rotation) is an angle which is ⅓ of the interval between the pins 31 because the gear has a reduction ratio of 1/12.

As shown in FIG. 9(B), the sprocket operation angle reaches 360 degrees when the drive motor 33 is operated 12 times. In such a rough configuration example, the absolute sensor 48 detects, for example, the position (position of 120 degrees) where the fourth operation is terminated, as shown in FIG. 9(C).

In this case, use of 5 degrees in the opposite ends are prevented in consideration of errors of the respective transmission gears, sensor noise, etc., and angle information as to the range of 120 degrees±12.5 degrees is detected so that information about the positions of the pins 31 of the simplified sprocket 61 (pin position information) can be detected roughly.

However, as shown in FIG. 11(A), the transmission gears and the absolute sensor 48 are not ideal but have errors, which may spread over a range of the next operation position. In such a case, the positions of the pins 31 are detected erroneously.

That is, although it should be determined that the operation position is ⅓ from the second pin if the absolute sensor 48 is ideal, it may be determined that the operation position is ⅔ from the second pin due to a large error as shown in FIG. 11(B).

In order to eliminate such erroneous determination, detection angles ($\theta 0, \theta 1, \theta 2, \ldots \theta 11$) of the absolute sensor 48 corresponding to numbers of times of operation when there is an error in the absolute sensor 48 are obtained as shown in FIG. 12. Those detection angles are associated with minimum operation amounts (0, ⅓, ⅔, . . . ) in the correction table A shown in FIG. 13. The erroneous determination can be eliminated using the correction table A.

In this manner, the tape feeder gear unit 11 rotationally drives the sprocket 32 by means of the drive motor 33, and acquires the angle information of the absolute sensor 48 provided in a transmission gear whenever the drive motor 33 is rotationally driven at a predetermined angle. The correction table A (inside the thick frame in FIG. 13) is created based on the angle error information between the theoretical rotation angle of the drive motor 33 and the angle information of the absolute sensor 48. Using the correction table A, the rotation of the drive motor 33 is controlled by the feeder control unit 35. However, when the linearity of the absolute sensor 48 is not so bad, the correction table A does not have to be used on purpose.

According to the correction table A, use of the correction table based on the angle error information can eliminate erroneous detection even when the absolute sensor 48 is not ideal but has an error. In addition, the correction table A can be created without the external measuring instrument 57 (camera or rotary encoder).

Figure 14:
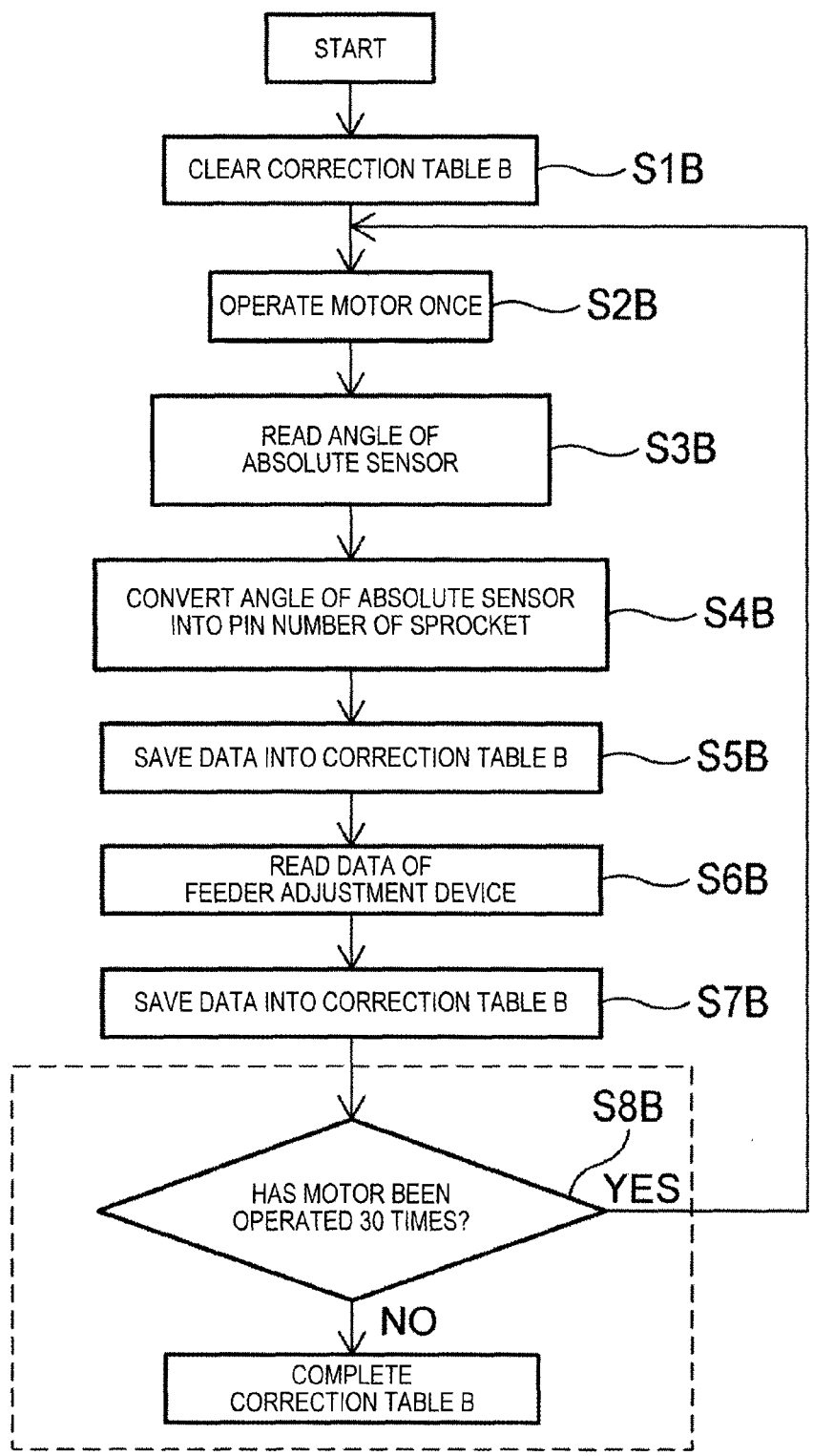
FIG. 14 is a flow chart showing a procedure for creating a correction table B.

FIG. 14 is a flow chart showing a procedure for creating the correction table B using the external measuring instrument 57 (camera or rotary encoder).

The correction table B is a correction table based on angle information of the drive motor 33 with respect to the pin position of the sprocket 32 and the angle information of the absolute sensor 48.

The correction table B is cleared in Step (S1B). The drive motor 33 is operated once in Step 2 (S2B). The angle information of the absolute sensor 48 is read in Step 3 (S3B). The angle information of the absolute sensor 48 is converted into the pin number of the sprocket 32 in Step 4 (S4B). Data of the absolute sensor 48 are saved into the correction table B in Step 4 (S5B). The angle information of the absolute sensor 48 may be a constant width of angle information for one pin number. A displacement of the pin position of the sprocket 32 is measured by the external measuring instrument 57 in Step 6 (S6B). Data of angle information (displacement) of the drive motor 33 are saved into the correction table B in Step 7 (S7B). Whether the sprocket 32 has made one full rotation (in this case, the drive motor 33 has operated 30 times) or not is checked in Step 8 (S8B). When the drive motor 33 has operated 30 times, the correction table B is completed. When the drive motor 33 has not operated 30 times, Step 2 (S2B) to Step 8 (S8B) are repeated.

FIG. 15 is a view for explaining the correction table B.

Here, the correction table B will be described using a simplified sprocket 61 similar to the above-described one by way of example. The correction table B is obtained by use of the external measuring instrument 57. When there is no processing error in the transmission gears and the sprocket 32, the angle corresponding to the number of times of operation draws an ideal angle shown in FIG. 15. However, an actual angle is an angle including an error ($\alpha 0, \alpha 1, \alpha 2, \ldots \alpha 11$).

Here, description will be made about a method for detecting an error angle by means of the external measuring instrument 57, and angle information (displacement) data saved in Step 7 (S7B). (The description will be made using the sprocket 32 needing position control with higher accuracy than the simplified sprocket 61 though the same thing can be applied to the simplified sprocket 61.)

The drive motor 33 is operated once in Step 2 (S2B). Information about the pin number of the sprocket 32 is acquired from the angle information of the absolute sensor 48 at that time, and the acquired information is saved as pin information of the correction table B (S3B, S4B and S5B).

Next, a displacement of the pin position of the sprocket 32 is measured by the external measuring instrument 57. The number of counts by an ABZ encoder (not shown, see FIG. 10) provided inside the drive motor 33 is calculated correspondingly to the measured displacement, and the calculated number of counts is saved into the correction table B as the angle information (displacement) of the drive motor 33 corresponding to the pin number at that time (S6B and S7B).

The sprocket 32 is rotationally driven on the basis of the rotation of the drive motor 33. However, there is a dimensional error in a gear due to processing accuracy. In a gear train including a plurality of gears, errors of the gears are further piled up. Thus, in most cases, the pin position of the sprocket 32 is displaced from its regular position.

Therefore, the pin position of the sprocket 32 standardized by the rotation of the drive motor 33 is measured by the external measuring instrument 57. When a high-precision rotary encoder is used as the external measuring instrument 57, the operation angle (corresponding to the number of counts) of the drive motor corresponding to the error angle is calculated from the obtained angle information, and the calculated operation angle is set as the angle information (displacement) data saved in Step 7 (S7B).

When the external measuring instrument 57 is an optical measuring instrument such as a camera, the quantity of horizontal (for example, the left/right direction in FIG. 4(C)) movement of the pin position of the sprocket 32 from the regular position is converted (calculated) into the rotation angle (displacement) of the drive motor 33, and the obtained rotation angle is set as the angle information (displacement) data saved in Step 7 (S7B).

As described above, when the transmission gears or the absolute sensor 48 is not ideal but has a large error, the correction table A may be used together with the correction table B (not to say, even when the error is large, the angle information of the absolute sensor 48 may be read directly and converted into the pin number of the sprocket 32).

In order to eliminate such a rotation error, an error ($\alpha 0$, $\alpha 1$, $\alpha 2$, ... $\alpha 11$) in the actual angle is obtained. The obtained error is associated with the minimum operation amount in the correction table B shown in FIG. 16 so that the error can be eliminated when the correction table B is used. That is, a command value to the drive motor 33 is increased/decreased using the correction table B so as to cancel the error. The correction value in the correction table B may be angle data or control information in which the angle data is converted into a value of a motor command. However, the driving control of the sprocket 32 is characterized in that angle information obtained by an ABZ encoder (for example, a motor encoder which counts 1,440 when the drive motor makes one full rotation) provided in the drive motor 33 is also used.

That is, the tape feeder gear unit 11 acquires angle information of the absolute sensor 48 for each angle with which one full rotation of the sprocket 32 is divided equally, and angle information obtained from the motor encoder provided in the drive motor 33, and creates the correction table B (inside the thick frame in FIG. 15) based on the angle information of the absolute sensor 48 and the angle of the drive motor 33 in order to rotate the sprocket 32 at each angle.

Then, the drive motor 33 is rotationally controlled by the feeder control unit 35 using the correction table B.

In addition, the angle information of the absolute sensor 48 for each angle with which one full rotation of the sprocket 32 is divided equally is not limited to the manner in which one full rotation is divided equally by the number of pins, but an interval between pins may be further divided equally. Due to narrower equal division in such a manner, the correction table B can be created comparatively easily when a rotary encoder with high resolution is used as the external measuring instrument 57. Alternatively, even in the case where an optical instrument such as a camera is used, the correction table B can be created when calculation is also used.

According to the correction table B, the drive motor 33 can be rotationally controlled based on the correction table having a correction value for each pin of the sprocket 32, so that the stop position of the tape 26 after pitch feeding or the stop position of the sprocket 32 after index rotation can be adjusted to its reference stop position.

Particularly as to the angle information of the absolute sensor 48, it will go well only if which pin of the sprocket 32 is close to the absolute sensor 48 can be recognized. Therefore, even when a high-precision sensor is not used as the absolute sensor but a very cheap sensor is used, accurate control can be achieved if information of a high-resolution motor encoder originally provided inside the drive motor 33 is also used.

Further, when the correction table A based on the angle error information of the absolute sensor 48 with respect to the theoretical rotation angle of the drive motor 33 is used, accurate control can be achieved in spite of extremely bad linearity in the absolute sensor 48.

In the tape feeder 10 and the tape feeder gear unit 11 configured thus, a sensor is disposed to face a transmission gear which is provided in the sprocket 32 and whose rotation ratio to the final gear 42 is 1:N. Thus, it is not necessary to dispose the sensor in an opening of a side surface of the sprocket 32 which is especially large of constituent parts of the tape feeder 10.

Also in this configuration, the final gear 42 shown in FIG. 5 is coaxially fixed to the sprocket 32 in the same manner as in the background-art configuration. The rotation axis of the sprocket 32 extends in the width W direction of the feeder housing 41. Therefore, the sprocket 32 on which the final gear 42 is put coaxially becomes larger in thickness. As a result, only a small gap Ws shown in FIG. 5 can be secured between the sprocket 32 and the feeder housing 41. Therefore, when the transmission gear whose rotation ratio to the final gear 42 is 1:N (that is, the third transmission gear 47) is a single gear, a large gap Wb in which a sensor can be disposed sufficiently can be secured in the width W direction of the feeder housing 41 within the region where the third transmission gear 47 is disposed. Thus, a space where the sprocket 32, the final gear 42 and the sensor should be arranged does not have to be secured in the width W direction of the feeder housing 41, but the enlargement of the tape feeder 10 in the thickness direction can be suppressed.

In addition, in the tape feeder 10, the rotation ratio between the transmission gear (third transmission gear) whose angle is detected by the sensor and the final gear 42 is 1:1. Therefore, the angle of the sprocket 32 can be detected at a high speed by simple calculation processing.

Further, according to the tape feeder 10, the third transmission gear 47 is provided on the opposite side to the sprocket 32 with respect to the width-direction center line 44 of the tape feeder 10. Thus, transmission gears can be disposed between the drive gear 43 and the sprocket 32 in the width direction of the feeder housing 41. To say other words, the sprocket 32 can be disposed by effective use of the thickness-direction space where the drive motor 33 is disposed.

Thus, the tape feeder 10 and the tape feeder gear unit 11 according to the invention can be made thin while accurately adjusting the stop position of the tape 26 after pitch feeding.

The present application is based on a Japanese patent application (Patent Application No. 2012-136936) filed on Jun. 18, 2012, the contents of which will be incorporated herein by reference.

INDUSTRIAL APPLICABILITY

The present invention is suitably applied to a tape feeder and a tape feeder gear unit which are attached to an electronic component mounting apparatus so as to supply electronic components.

DESCRIPTION OF REFERENCE SIGNS

10: Tape Feeder
11: Tape Feeder Gear Unit
12: Electronic Component Mounting Apparatus
26: Tape (Carrier Tape)
30: Feed Hole
31: Pin
32: Sprocket
33: Drive Motor
35: Feeder Control Unit (Control Means)
40: Gear Unit
42: Final Gear 43: Drive Gear
44: Width-Direction Center Line
47: Third Transmission Gear (Transmission Gear)
48: Absolute Sensor (Sensor)
A, B: Correction Table

The invention claimed is:

1. A tape feeder in which a carrier tape retaining electronic components is pitch-fed by a gear unit so as to supply an electronic component to a pickup position of an electronic component mounting apparatus, the gear unit comprising:
   a sprocket which comprises pins provided on a periphery thereof and a final gear, the pins meshing with feed holes provided at equal pitches in the carrier tape; and
   at least one transmission gear disposed between a drive motor and the final gear,
   wherein a sensor which detects an angle of one of the at least one transmission gear is provided to face the one of the at least one transmission gear, wherein a rotation ratio of the one of the at least one transmission gear to the final gear is 1:1 and the one of the at least one transmission gear directly meshes with the final gear.

2. The tape feeder according to claim 1,
   wherein a drive gear provided on an output shaft of the drive motor is provided on an opposite side to the sprocket with respect to a center line of the tape feeder in a width direction.

3. A tape feeder gear unit which pitch-feeds a carrier tape retaining electronic components so as to supply an electronic component to a pickup position of an electronic component mounting apparatus, said tape feeder gear unit comprising:
   a sprocket which comprises pins provided on a periphery thereof and a final gear, the pins meshing with feed holes provided at equal pitches in the carrier tape; and
   at least one transmission gears disposed between a drive motor and the final gear,
   wherein a sensor which detects an angle of one of the at least one transmission gear is provided to face the one of the at least one transmission gear, wherein a rotation ratio of the one of the at least one transmission gear to the final gear is 1:1 and the one of the at least one transmission gear directly meshes with the final gear.

4. The tape feeder gear unit according to claim 3, comprising a control unit which:
   rotationally drives the sprocket by the drive motor;
   acquires angle information of the sensor provided in the transmission gear for each of angles with which one full rotation of the sprocket is divided equally, and angle information obtained from a motor encoder provided inside the drive motor;
   creates a correction table for rotating the sprocket at each of the angles based on the angle information of the sensor and the angle information of the drive motor; and
   rotationally controls the drive motor using the correction table.

5. The tape feeder gear unit according to claim 4, wherein the control unit:
   acquires angle information of the sensor provided in the at least one transmission gear whenever the drive motor is rotationally driven at a constant angle; and
   creates a correction table based on angle error information between a theoretical rotation angle of the drive motor and the angle information of the absolute sensor.

* * * * *